(12) United States Patent
Suzuki et al.

(10) Patent No.: US 10,396,010 B2
(45) Date of Patent: Aug. 27, 2019

(54) ONBOARD CONTROL DEVICE

(71) Applicant: HITACHI AUTOMOTIVE SYSTEMS, LTD., Ibaraki (JP)

(72) Inventors: Kazuhiro Suzuki, Tokyo (JP); Toshiaki Ishii, Tokyo (JP); Yoshio Kawai, Hitachinaka (JP); Yujiro Kaneko, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/763,380

(22) PCT Filed: Aug. 8, 2016

(86) PCT No.: PCT/JP2016/073222
§ 371 (c)(1),
(2) Date: Mar. 26, 2018

(87) PCT Pub. No.: WO2017/056735
PCT Pub. Date: Apr. 6, 2017

(65) Prior Publication Data
US 2018/0277460 A1  Sep. 27, 2018

(30) Foreign Application Priority Data
Sep. 29, 2015 (JP) ................. 2015-190611

(51) Int. Cl.
*H01L 23/367* (2006.01)
*B29C 45/14* (2006.01)
(Continued)

(52) U.S. Cl.
CPC .... *H01L 23/3675* (2013.01); *B29C 45/14836* (2013.01); *B60R 16/02* (2013.01);
(Continued)

(58) Field of Classification Search
CPC ......... H05K 7/20845–20854; B29C 45/14836; B29C 2045/0049
See application file for complete search history.

(56) References Cited

U.S. PATENT DOCUMENTS 4,768,286 A    9/1988  Ketcham
4,771,365 A *  9/1988  Cichocki .............. H05K 7/1421
                                                    165/80.3
(Continued)

FOREIGN PATENT DOCUMENTS

JP    03-278596 A    12/1991
JP    2002-158316 A   5/2002
(Continued)

OTHER PUBLICATIONS

International Search Report dated Nov. 29, 2016 of the PCT International Application No. PCT/JP2016/073222.
(Continued)

*Primary Examiner* — Robert J Hoffberg
(74) *Attorney, Agent, or Firm* — Vople and Koenig, P.C.

(57) ABSTRACT

Provided is an inexpensive and highly reliable resin sealed-type onboard electronic control device is mounted in a vehicle such as an engine control unit and a control unit for automatic transmission, which have a heat dissipation structure for dissipating heat generated from an electronic component such as a semiconductor element. The onboard control device includes a circuit board, a member provided to face the circuit board, a heat generating electronic component mounted between the circuit board and the member, a heat dissipating material provided between the heat generating electronic component and the member, and a sealing resin to seal the circuit board and the heat generating electronic component. And a space between the member and the circuit board is at least a part of a range where the heat (Continued)

10···· HEAT DISSIPATING METAL BASE
11···· HEAT DISSIPATING METAL BASE PROJECTING PORTION
20···· SEALING COVER
30···· CONNECTOR
31···· METAL TERMINAL
40···· CONTROL CIRCUIT BOARD
41···· ELECTRONIC COMPONENT
42···· HEAT GENERATING ELECTRONIC COMPONENT
50···· HEAT DISSIPATING MATERIAL
70···· SEALING RESIN

110···· ELECTRONIC CONTROL DEVICE ACCORDING TO PRESENT INVENTION dissipating material is not provided, and is narrower than a range where the heat dissipating material is provided.

7 Claims, 13 Drawing Sheets

(51) Int. Cl.

| | |
|---|---|
| H05K 7/20 | (2006.01) |
| H05K 1/02 | (2006.01) |
| B60R 16/02 | (2006.01) |
| H01L 23/28 | (2006.01) |
| H01L 23/36 | (2006.01) |
| H01L 25/07 | (2006.01) |
| H01L 25/18 | (2006.01) |
| B60R 16/023 | (2006.01) |
| H01L 21/56 | (2006.01) |
| H01L 23/04 | (2006.01) |
| H01L 23/31 | (2006.01) |
| H01L 23/373 | (2006.01) |
| H01L 23/00 | (2006.01) |
| H01L 25/16 | (2006.01) |
| B29C 45/00 | (2006.01) |

(52) U.S. Cl.
CPC ........ *B60R 16/0231* (2013.01); *H01L 21/565* (2013.01); *H01L 23/04* (2013.01); *H01L 23/28* (2013.01); *H01L 23/3121* (2013.01); *H01L 23/36* (2013.01); *H01L 23/3736* (2013.01); *H01L 24/32* (2013.01); *H01L 25/07* (2013.01); *H01L 25/165* (2013.01); *H01L 25/18* (2013.01); *H05K 1/0203* (2013.01); *H05K 7/20* (2013.01); *H05K 7/209* (2013.01); *H05K 7/20454* (2013.01); *H05K 7/20463* (2013.01); *B29C 2045/0049* (2013.01); *H01L 2224/32245* (2013.01)

(56) References Cited

U.S. PATENT DOCUMENTS

| | | | | |
|---|---|---|---|---|
| 5,373,418 | A | 12/1994 | Hayasi | |
| 6,816,377 | B2* | 11/2004 | Itabashi | H05K 7/205 |
| | | | | 174/252 |
| 7,359,212 | B2* | 4/2008 | Mayuzumi | H05K 3/284 |
| | | | | 361/760 |
| 8,021,925 | B2* | 9/2011 | Edwards | H01L 23/04 |
| | | | | 257/704 |
| 8,243,454 | B2* | 8/2012 | Oota | H01L 23/42 |
| | | | | 165/80.3 |
| 8,355,254 | B2* | 1/2013 | Oota | B62D 5/0406 |
| | | | | 174/520 |
| 8,657,609 | B2* | 2/2014 | Yanagisawa | H05K 5/0056 |
| | | | | 439/79 |
| 8,711,041 | B2* | 4/2014 | Han | H01Q 5/40 |
| | | | | 343/702 |
| 8,976,074 | B2* | 3/2015 | Sung | H01Q 1/243 |
| | | | | 343/872 |
| 9,211,665 | B2* | 12/2015 | Eggmann | B29C 45/14065 |
| 9,266,266 | B2* | 2/2016 | Hong | H01Q 5/40 |
| 9,385,387 | B2* | 7/2016 | Suzuki | B29C 45/0046 |
| 9,480,189 | B2* | 10/2016 | Kawai | H05K 1/0203 |
| 9,806,354 | B2* | 10/2017 | Suzuki | B29C 45/0046 |
| 9,908,271 | B2* | 3/2018 | Eggmann | B29C 45/14065 |
| 10,028,412 | B2* | 7/2018 | Negishi | H01L 23/3675 |
| 2006/0077643 | A1 | 4/2006 | Mayuzumi et al. | |
| 2007/0045819 | A1 | 3/2007 | Edwards et al. | |
| 2009/0103267 | A1* | 4/2009 | Wieland | H05K 7/20409 |
| | | | | 361/707 |
| 2016/0021789 | A1 | 1/2016 | Negishi et al. | |
| 2016/0276245 | A1 | 9/2016 | Murai et al. | |

FOREIGN PATENT DOCUMENTS

| | | |
|---|---|---|
| JP | 2006-086296 A | 3/2006 |
| JP | 2006-108398 A | 4/2006 |
| JP | 2014-187063 A | 10/2014 |
| WO | 2015/102046 A1 | 7/2015 |

OTHER PUBLICATIONS

Extended European Search Report dated Apr. 8, 2019 for the European Patent Application No. 16850912.3.

* cited by examiner

10 ···· HEAT DISSIPATING METAL BASE
11 ···· HEAT DISSIPATING METAL BASE PROJECTING PORTION
20 ···· SEALING COVER
30 ···· CONNECTOR
31 ···· METAL TERMINAL
40 ···· CONTROL CIRCUIT BOARD
41 ···· ELECTRONIC COMPONENT
42 ···· HEAT GENERATING ELECTRONIC COMPONENT
50 ···· HEAT DISSIPATING MATERIAL
70 ···· SEALING RESIN

110 ···· ELECTRONIC CONTROL DEVICE ACCORDING TO PRESENT INVENTION

10····  HEAT DISSIPATING METAL BASE
11····  HEAT DISSIPATING METAL BASE PROJECTING PORTION
20····  SEALING COVER
30····  CONNECTOR
31····  METAL TERMINAL
40····  CONTROL CIRCUIT BOARD
41····  ELECTRONIC COMPONENT
42····  HEAT GENERATING ELECTRONIC COMPONENT
50····  HEAT DISSIPATING MATERIAL
70····  SEALING RESIN

110····  ELECTRONIC CONTROL DEVICE ACCORDING TO PRESENT INVENTION

10 · · · · HEAT DISSIPATING METAL BASE
20 · · · · SEALING COVER
30 · · · · CONNECTOR
31 · · · · METAL TERMINAL
40 · · · · CONTROL CIRCUIT BOARD
41 · · · · ELECTRONIC COMPONENT
42 · · · · HEAT GENERATING ELECTRONIC COMPONENT
50 · · · · HEAT DISSIPATING MATERIAL
80 · · · · WATERPROOF FILTER
90 · · · · ADHESIVE

200 · · · · CONVENTIONAL ELECTRONIC CONTROL DEVICE

10 ···· HEAT DISSIPATING METAL BASE
11 ···· HEAT DISSIPATING METAL BASE PROJECTING PORTION
40 ···· CONTROL CIRCUIT BOARD
41 ···· ELECTRONIC COMPONENT
42 ···· HEAT GENERATING COMPONENT
50 ···· HEAT DISSIPATING MATERIAL

63 ···· MOLD MEMBER

70 ···· SEALING RESIN

10 · · · · HEAT DISSIPATING METAL BASE
11 · · · · HEAT DISSIPATING METAL BASE PROJECTING PORTION

FIG. 6

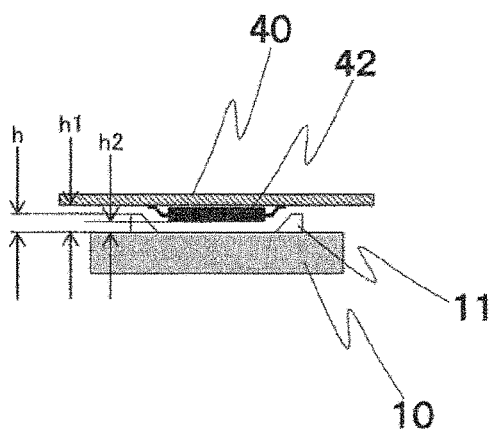

h : HEIGHT OF PROJECTING PORTION
h1 : SPACE BETWEEN HEAT DISSIPATING METAL BASE AND CONTROL CIRCUIT BOARD
h2 : SPACE BETWEEN HEAT DISSIPATING METAL BASE AND HEAT GENERATING ELECTRONIC COMPONENT

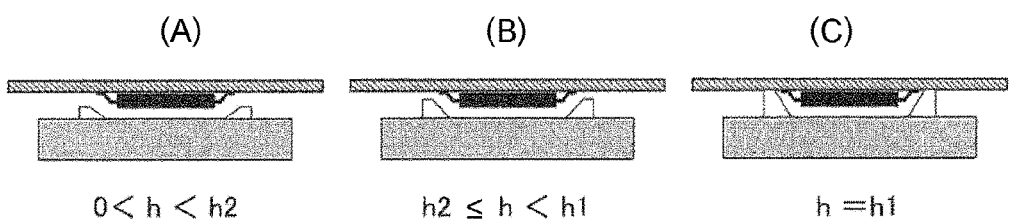

(A) $0 < h < h2$   (B) $h2 \leq h < h1$   (C) $h = h1$

10 ···· HEAT DISSIPATING METAL BASE
11 ···· STRUCTURE SURROUNDING HEAT DISSIPATING METAL BASE
40 ···· CONTROL CIRCUIT BOARD
41 ···· ELECTRONIC COMPONENT
42 ···· HEAT GENERATING COMPONENT
50 ···· HEAT DISSIPATING MATERIAL
70 ···· SEALING RESIN

10 ···· HEAT DISSIPATING METAL BASE
11 ···· HEAT DISSIPATING METAL BASE PROJECTING PORTION
20 ···· SEALING COVER
30 ···· CONNECTOR
31 ···· METAL TERMINAL
40 ···· CONTROL CIRCUIT BOARD
41 ···· ELECTRONIC COMPONENT
42 ···· HEAT GENERATING ELECTRONIC COMPONENT
50 ···· HEAT DISSIPATING MATERIAL
70 ···· SEALING RESIN

10···· HEAT DISSIPATING METAL BASE
11···· HEAT DISSIPATING METAL BASE PROJECTING PORTION
40···· CONTROL CIRCUIT BOARD
41···· ELECTRONIC COMPONENT
42··· HEAT GENERATING COMPONENT
50···· HEAT DISSIPATING MATERIAL

63···· MOLD MEMBER

70···· SEALING RESIN

10 ···· HEAT DISSIPATING METAL BASE
11 ···· HEAT DISSIPATING METAL BASE PROJECTING PORTION
40 ···· CONTROL CIRCUIT BOARD
41 ···· ELECTRONIC COMPONENT
42 ···· HEAT GENERATING ELECTRONIC COMPONENT
50 ···· HEAT DISSIPATING MATERIAL

63 ···· MOLD MEMBER

70 ···· SEALING RESIN

10 · · · · HEAT DISSIPATING METAL BASE
11 · · · · HEAT DISSIPATING METAL BASE PROJECTING PORTION

10···· HEAT DISSIPATING METAL BASE
11···· HEAT DISSIPATING METAL BASE PROJECTING PORTION
20···· SEALING COVER
30···· CONNECTOR
31···· METAL TERMINAL
40···· CONTROL CIRCUIT BOARD
41···· ELECTRONIC COMPONENT
42 ···· HEAT GENERATING ELECTRONIC COMPONENT
50···· HEAT DISSIPATING MATERIAL
70···· SEALING RESIN

ONBOARD CONTROL DEVICE

TECHNICAL FIELD

The present invention relates to an electronic control device mounted in a vehicle.

BACKGROUND ART

A plurality of heat generating electronic components such as an arithmetic processing unit and a semiconductor element are incorporated in a casing of an electronic control unit mounted in a vehicle such as an engine control unit and a control unit for automatic transmission, and an internal temperature tends to increase. Therefore, a heat dissipation structure has been developed in which heat generated by electronic components is transferred to a casing of a device and released from a surface of the casing to the outside of the casing (for example, PTL 1).

Further, in recent years, the thermal environment of an electronic control unit mounted in a vehicle is increasingly severe. Background is that the electronic control unit is exposed to a higher temperature than ever since the installation location is changed from the inside of a vehicle to an engine room and on-engine, and also since heat generation per volume increases due to miniaturization of the electronic control unit. Further, with such change in the mounting environment, level of vibration/impact resistance required to the electronic control device increases.

CITATION LIST

Patent Literature

PTL 1: JP 2014-187063 A

SUMMARY OF INVENTION

Technical Problem

To secure heat resistance and vibration/impact resistance, it is advantageous to adopt an entire resin sealing configuration in which electronic components and a circuit board are sealed with resin. However, in the configuration disclosed in JP 2014-187063 A, if the resin sealing method is applied as it is, the following problem occurs.

A heat dissipating material (particularly in the case of a flexible material such as heat dissipating grease) for dissipating heat generated by a heat generating component is flowed or deformed resin flow, and therefore heat dissipation targeted in design cannot be realized.

In the resin sealing method, a structure including a connector, a control circuit board on which various components are mounted, and a heat dissipating base is set in a metal mold, molten resin is injected from a resin injection hole of the metal mold, and the resin is cured in the metal mold and taken out in a general flow. Since this injected resin has a set pressure and flow rate, it is necessary for the sealed member to have strength to withstand this resin flow. If the strength is insufficient, destruction, deformation, and trouble will occur in component members, and normal functions cannot be secured. Therefore, when a flexible material is used for a heat dissipating material, the above-described problem occurs.

In addition, in the conventional resin sealing method, resin filling into a narrow gap such as a mounting portion of a heat generating component on a control circuit board becomes insufficient, and there arises a problem in ensuring the reliability of a joint portion.

Further, in the conventional resin sealing method, deformation occurs in the control circuit board due to the influence of the resin flow, and stress remains on the mounted components and adversely affects the reliability.

An object of the present invention is to provide an inexpensive and reliable onboard control device in a resin sealed-type onboard electronic control device by eliminating the above-described problems related to resin sealing.

Solution to Problem

To achieve the above-described object, one of representative onboard control devices includes a circuit board, a member provided to face the circuit board, a heat generating electronic component mounted on the member side on the circuit board, a heat dissipating material provided between the heat generating electronic component and the member, and a sealing resin to seal the circuit board and the heat generating electronic component. A space between the member and the circuit board is at least a part of a range where the heat dissipating material is not provided, and narrower than a range where the heat dissipating material is provided.

Advantageous Effects of Invention

When a configuration according to the present invention is applied, resin-sealing can be performed by using hard or soft heat dissipating material. In addition, it is possible to fill a narrow gap around a heat generating component with resin. In addition, it is possible to eliminate residual stress due to deformation of a board during resin sealing. As a result, an inexpensive and reliable resin sealed-type onboard control device can be provided.

BRIEF DESCRIPTION OF DRAWINGS

FIG. 6 is a schematic cross-sectional view indicating the height of the heat dissipating metal base projecting portion of the onboard control device according to the present invention.

DESCRIPTION OF EMBODIMENTS

Hereinafter, embodiments of the present invention will be described with reference to the drawings.

Figure 3:
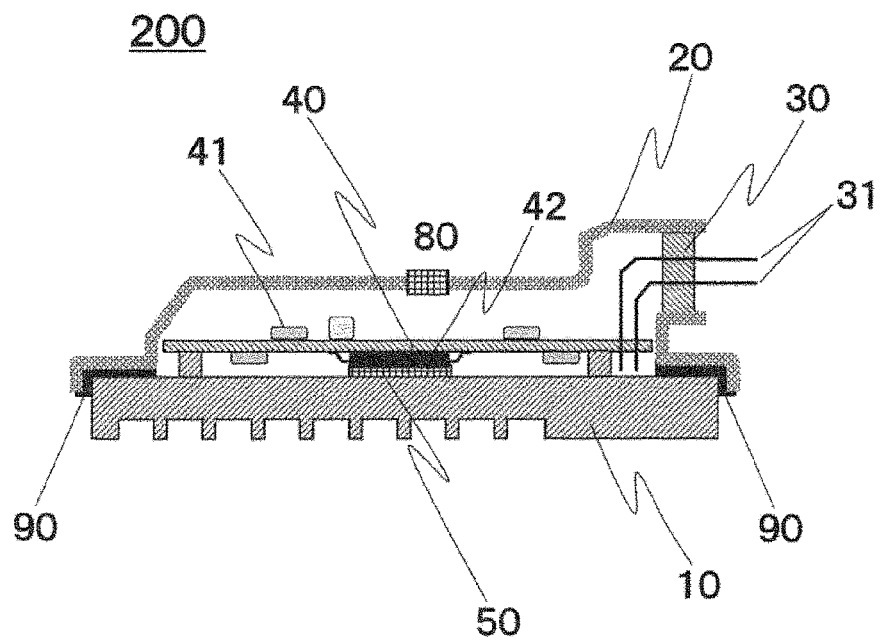
FIG. 3 is a schematic cross-sectional view illustrating an example of a conventional onboard control device.

FIG. 3 is a schematic cross-sectional view indicating the above-described heat dissipation structure. A heat dissipating material 50 is disposed between a heat generating electronic component 42 mounted on a control circuit board 40 and a heat dissipating metal base 10, and heat generated from the heat generating electronic component 42 is transmitted to a heat dissipating metal base via the heat dissipating material 50 and radiated to the outside of a casing. Heat dissipation grease is used as the heat dissipating material. The heat dissipating grease retains its viscosity even after application, and it is possible to suppress stress concentration on a solder joint portion of the heat generating electronic component. However, as described above, the problem remains when applying an electronic control device to a resin sealing structure as it is. A means for solving such problem will be specifically described below with reference to the drawings.

First Embodiment

Figure 1:
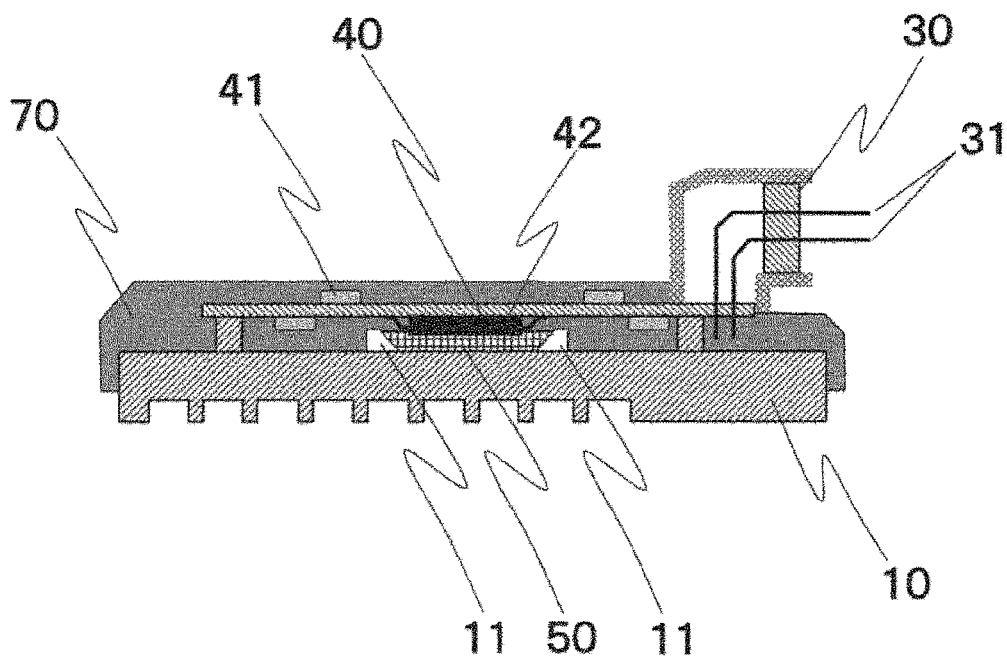
FIG. 1 is a schematic cross-sectional view of an onboard control device according to the present invention.
Figure 4:
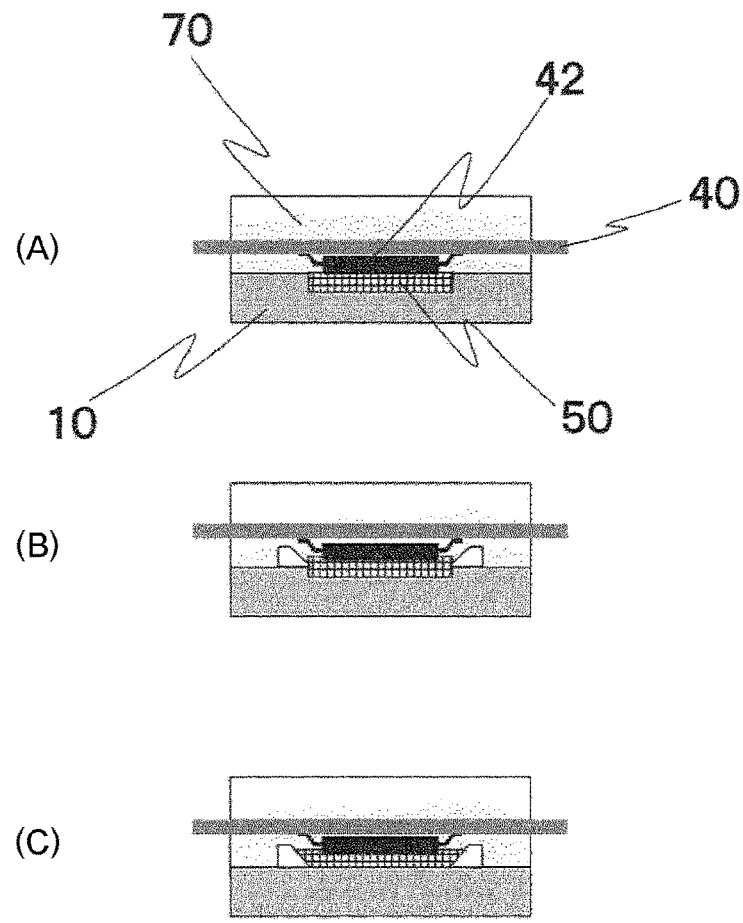
FIG. 4 is a schematic cross-sectional view illustrating a heat dissipating material arrangement configuration of a heat dissipating metal base according to the present invention.

FIG. 1 is a cross-sectional view of an onboard control device according to a first embodiment of the present invention. FIG. 4 indicates extraction of a local structure around a heat generating electronic component of FIG. 1. FIGS. 4(A), 4(B), and 4(C) are possible as a configuration according to the present invention. FIG. 4(A) indicates a configuration in which a recessed portion is provided in a region corresponding to a lower portion of the heat generating electronic component of the heat dissipating metal base 10, and the heat dissipating material 50 is disposed therein. FIG. 4(B) indicates a configuration in which a projecting portion is provided around the recessed portion in FIG. 4(A). In FIG. 4(C), the recessed portion of FIG. 4(B) is eliminated, and the projecting portion is left.

In FIG. 1, the configuration of FIG. 4(C) is applied. This assembling process is indicated in FIG. 7.

Figure 7:
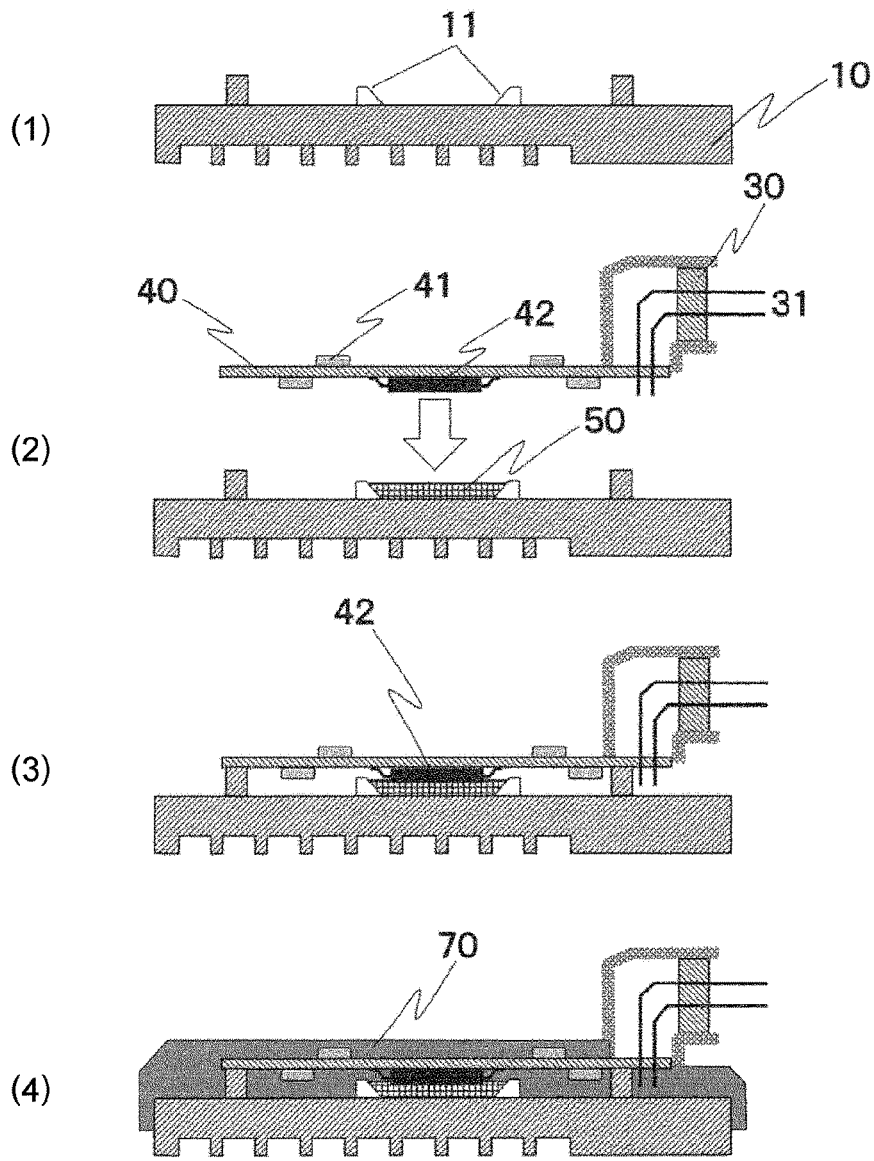
FIG. 7 is a schematic cross-sectional view indicating an assembly process of the onboard control device according to the present invention.

FIG. 7(1) indicates a heat dissipating metal base, which is made of, for example, an aluminum die-cast material. However, other metal materials may be used.

Figure 5:
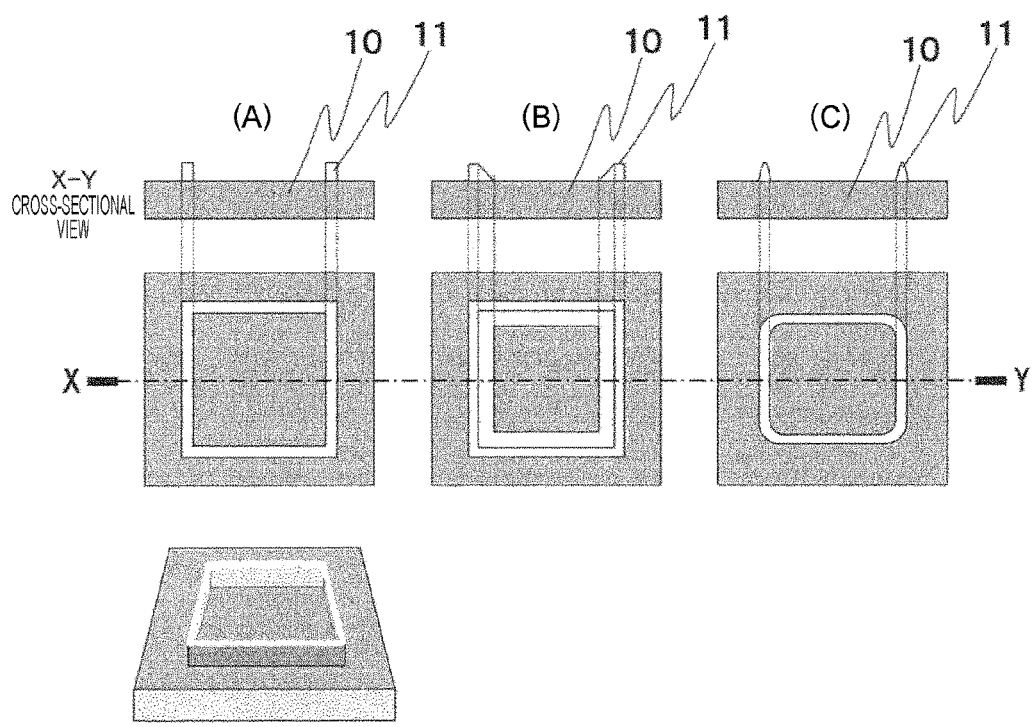
FIG. 5 is a schematic cross-sectional view and a perspective view illustrating a heat dissipating metal base projecting portion of the onboard control device according to the present invention.

One of the main characteristics of the present embodiment is that a projecting portion 11 is formed on the heat dissipating metal base 10. In the present embodiment, the projecting portion 11 is formed integrally with the heat dissipating metal base. As a shape of the projecting portion 11, various shapes can be applied. FIG. 5 indicates several examples. Only a perspective view of the case of (A) is indicated. A cross-sectional shape of the projecting portion can be various shapes and is not limited to the shapes indicated in FIG. 5.

As indicated in FIG. 7(2), a space on an inner side of the projecting portion 11 of the heat dissipating metal base 10 is filled with the heat dissipating material 50. To keep the heat dissipating material 50 in the space on the inner side of the projecting portion 11, at least a connecting portion on the heat dissipating metal base side of the projecting portion has a shape surrounding without discontinuity. Various materials can be selected as the heat dissipating material 50. Examples of the materials include, but are not limited to, a flexible heat dissipating grease, a heat dissipating silicone gel, a thermally conductive silicone adhesive, and a hard thermally conductive organic resin material. All of them are in an uncured state. The amount of filling of the heat dissipating material can be adjusted depending on a purpose. The amount of the heat radiating material can be adjusted by the amount of filling filled in the inner space of the projecting portion. Therefore, it is possible to manage a comparatively expensive heat dissipating material with a necessary minimum amount, and it is advantageous for reducing the cost. While positioning a connector 30 and various electronic components such as resistors, capacitors, diodes, ICs, FETs, and transistors which are small components mounted on a board, and the control circuit board 40 mounting the heat generating electronic component 42, those are fixed by setting in the heat dissipating metal base filled with the heat dissipating material 50 (FIG. 7(3)). Although the fixing structure of the control circuit board 40 is not indicated in FIG. 7(3), various methods including such as screw fixing, adhesion, and thermal caulking can be applied. At this time, it is necessary for the heat dissipating material 50 to contact or seal the heat generating component 42. Various methods can also be applied for curing the heat dissipating material 50. In the case of a thermosetting material, in the step of FIG. 7(3), a thermosetting process may be added, or curing may be performed simultaneously in the subsequent heating molding process. Materials other than the thermosetting material such as a moisture curing material and an ultraviolet curing property can be used, and a curing process may be appropriately added.

Figure 8:
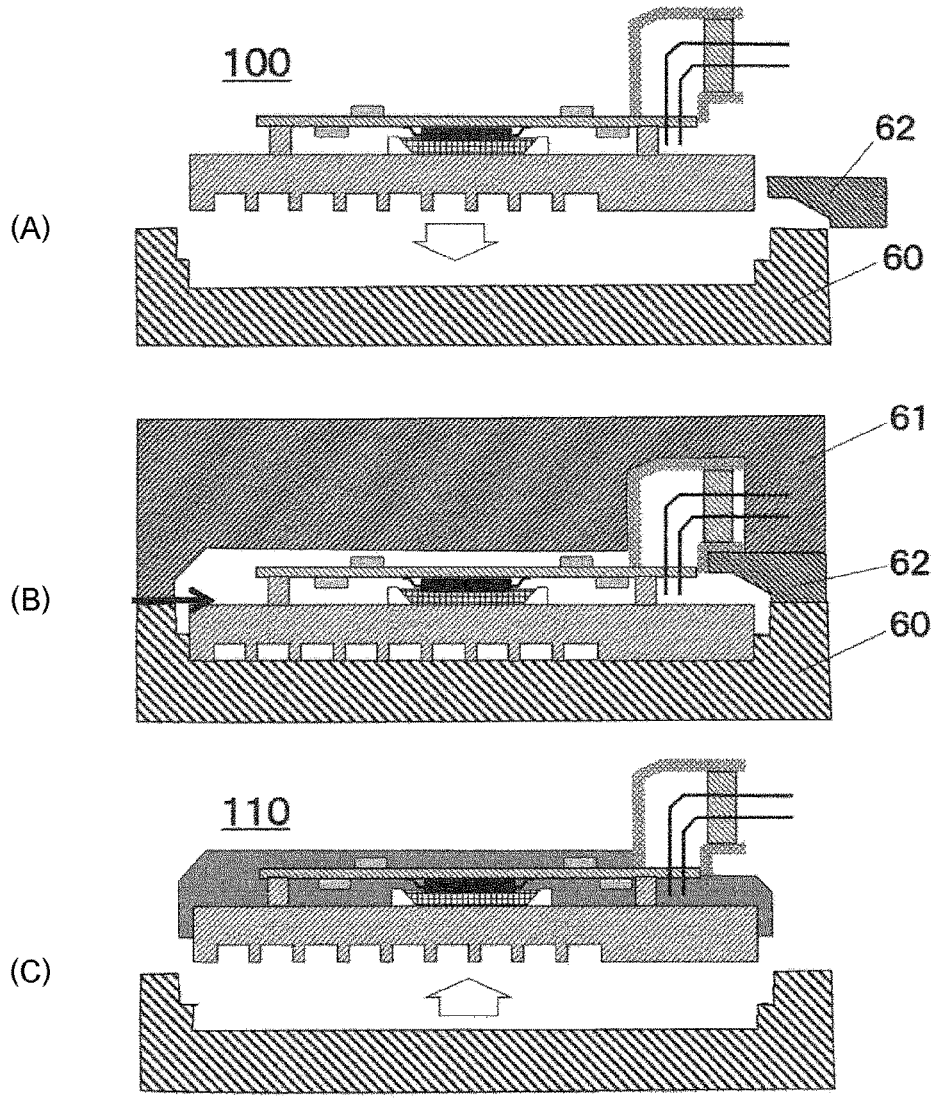
FIG. 8 is a schematic cross-sectional view indicating an assembly process of the onboard control device according to the present invention.

Next, through a molding process, finally, a resin sealed-type onboard control device of FIG. 7(4) (same as FIG. 1) is obtained. FIG. 8 indicates an example of the molding process. The structure of FIG. 7(3) is set in a mold (FIGS. 8(A) and 8(B)). In this state, for example, molten resin is injected into the mold from a direction indicated by the arrow in FIG. 8(B) to seal resin. The injected resin is a resin flow which is melted by heating and flowed at a predetermined pressure and flows at a flow rate necessary for filling a die gap before thermosetting. For this reason, it is necessary for the member to be sealed to have strength to withstand the resin flow.

Figure 13:
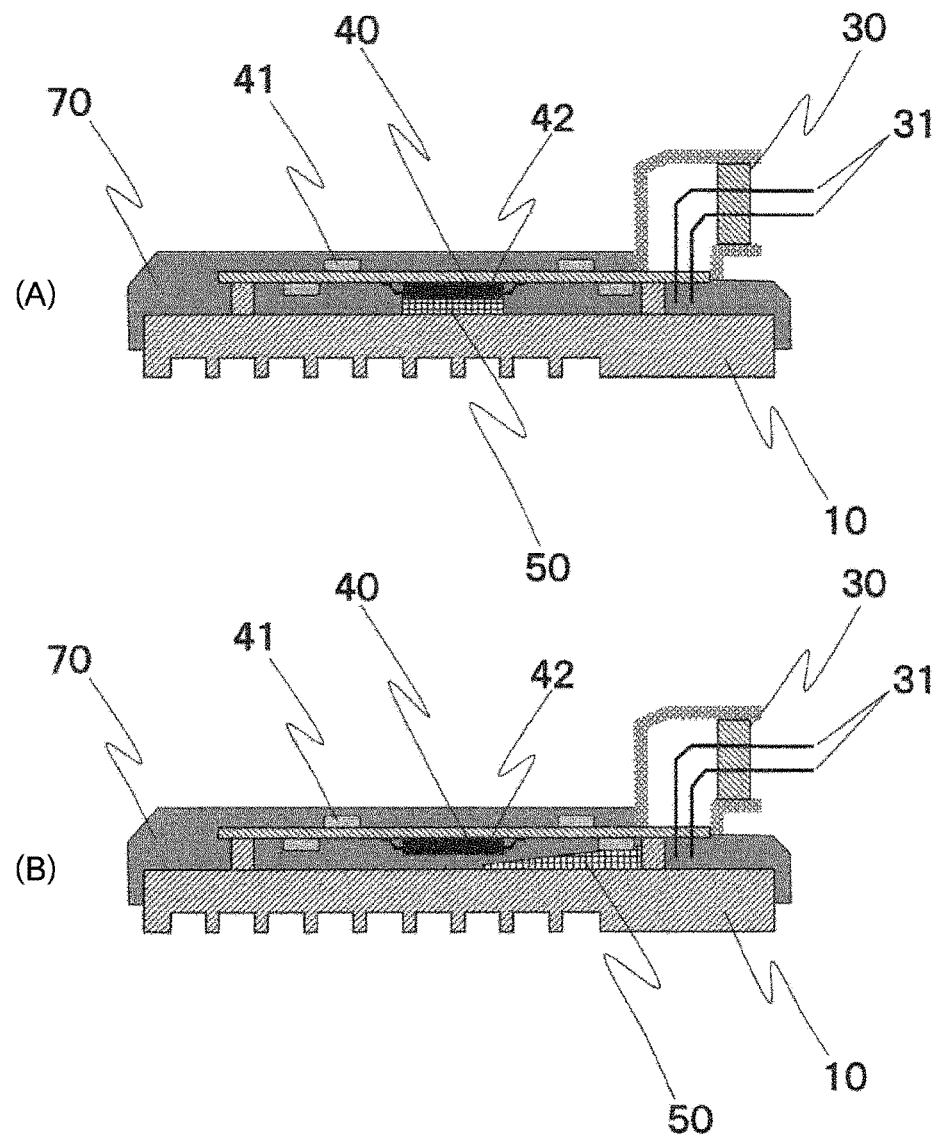
FIG. 13 is a schematic cross-sectional view of the onboard control device according to the present invention.

Attention should be paid particularly to the heat dissipating material 50 around the heat generating electronic component 42. Various materials can be applied to the heat dissipating material 50 from a flexible material to a hard material depending on a purpose. However, when a soft material is used, the heat dissipating material may be flowed or deformed in an environment where resin flow directly hits. In the case where a hard material is used for the heat dissipating material 50, a normal resin sealing state can be realized as indicated in FIG. 13(A) even if resin is directly injected as it is in a configuration of the conventional example. However, when a flexible material is used as the heat dissipating material, as indicated in FIG. 13(B), the heat dissipating material is flowed at the time of injecting the resin, and an abnormality occurs in a heat dissipating path of the heat generating electronic component 42.

Figure 9:
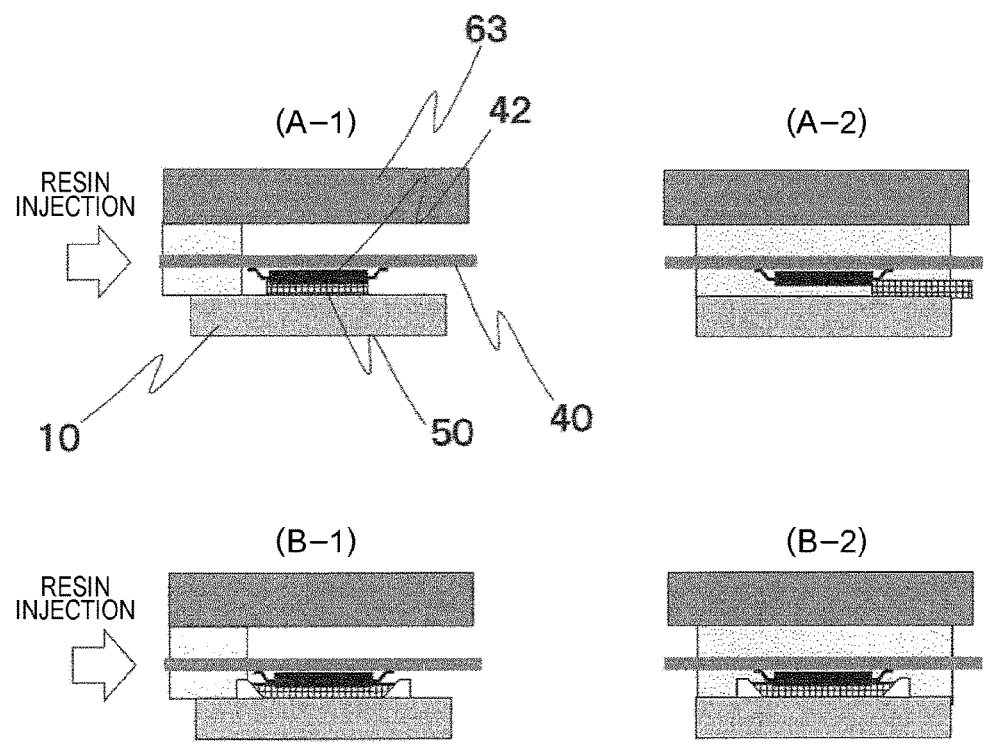
FIG. 9 is a schematic cross-sectional view indicating effects of the heat dissipating metal base projecting portion of the onboard control device according to the present invention.

FIG. 9 indicates the above-described appearance by extracting the periphery of the heat generating electronic component. FIG. 9(A-1) indicates the case where resin is injected as it is in the configuration of the conventional example. In the case of a flexible heat-dissipating material, the heat-dissipating material is flowed by the resin flow as indicated in (A-2), and the heat dissipation targeted in design cannot be realized. On the other hand, in the case of the configuration (B-1) according to the present invention, a projecting portion in which at least a part of a range where the heat dissipating material 50 is not provided is projecting is formed in a space between the heat dissipating metal base 10 and the control circuit board 40, and the space is narrower than a range where the heat dissipating material 50 is provided. As a result, since the heat dissipating metal base projecting portion functions as a breakwater, it is possible to protect the heat dissipating material from the resin flow. Although the case of a configuration indicated in FIG. 4(C) has been described above, also in the case of the configurations indicated in FIGS. 4(A) and 4(B), by forming a recessed portion, a space between the heat dissipating metal base 10 and the control circuit board 40 is a range where the heat dissipating material 40 is provided and wider than a range where the heat dissipating material 40 is not provided. The resin flow does not directly hit the heat dissipating material, and therefore an effect similar to the above-described effect can be expected.

According to the present embodiment, a recessed portion and a projecting portion are provided to the heat dissipating metal base, and the heat dissipating material is filled inside the heat dissipating metal base. Therefore, it is advantageous for saving the amount of the heat dissipating material and reducing costs, and the resin flow is protected so as not to hit the heat dissipating material directly. As a result, a flexible material can be used for the heat dissipating material.

Second Embodiment

Figure 2:
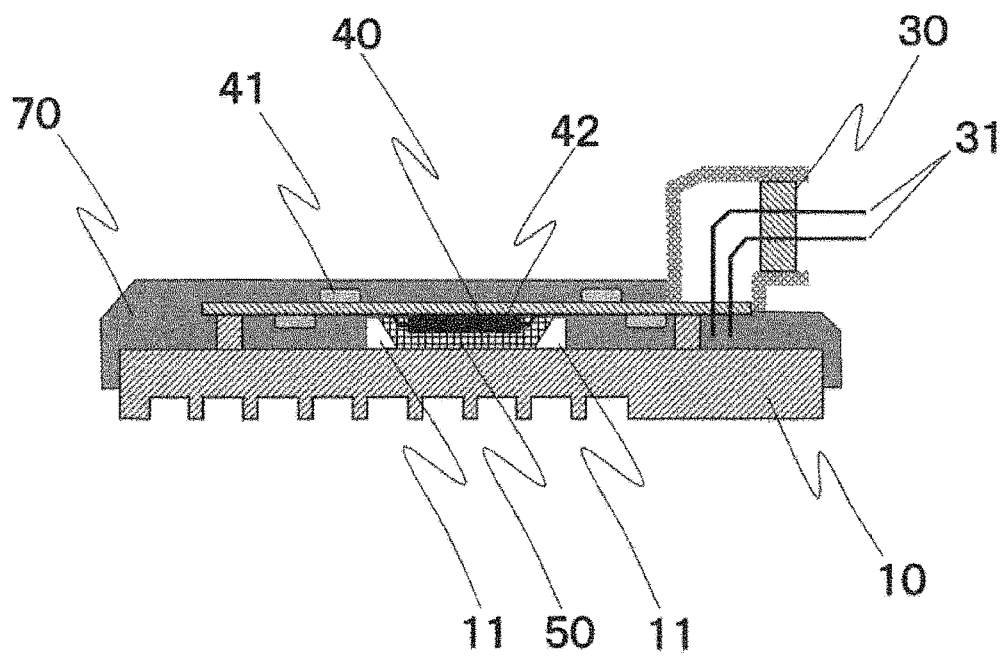
FIG. 2 is a schematic cross-sectional view of an onboard control device according to the present invention.
Figure 10:
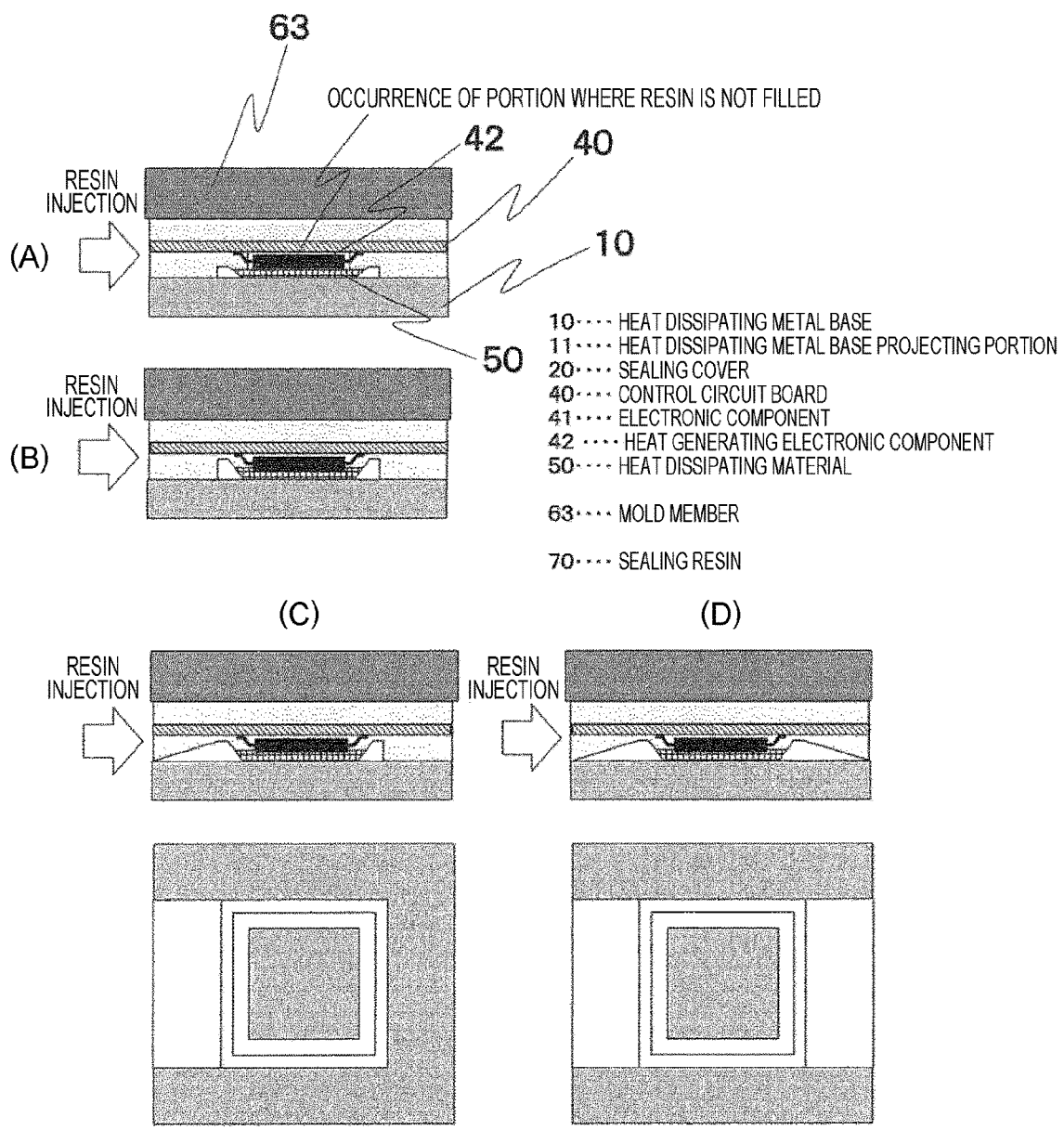
FIG. 10 is a schematic cross-sectional view indicating an effect of the heat dissipating metal base projecting portion of the onboard control device according to the present invention.

The present embodiment is a case where the heat dissipating metal base projecting portion according to the first embodiment has shapes illustrated in FIGS. 10(B), 10(C) and 10(D). As indicated in FIG. 6, various types heights of the heat dissipating metal base projecting portion can be applied, and expected effect contents differ in each. FIG. 6(A) indicates the effect described in the first embodiment, and FIG. 6(B) indicates the case of the present embodiment. FIG. 2 indicates a cross-sectional view of the onboard control device as an embodiment in the case of resin sealing with the configuration indicated in FIG. 6(B). Since the height of a projecting portion is high, the projecting portion can be filled with a large amount of the heat dissipating material 50. Therefore, the heat dissipating material 50 can be disposed so as to cover a lead portion of a heat generating electronic component, and the heat dissipation effect can be further enhanced.

As indicated in FIG. 10(A), a mounting portion on the control circuit board 40 side of the heat generating electronic component 42 includes many regions including narrow spaces such as between leads and under parts, and there is a possibility that resin does not sufficiently reach. If a space is provided in a component mounting portion joined by such as solder, it is conceivable that fatigue may occur in the joint portion due to stress such as a temperature cycle, and malfunction occurs. Therefore, it is necessary to sufficiently fill the resin even in a narrow space. If the heat dissipating metal base projecting portion according to the present invention is formed into a shape illustrated in FIGS. 10(B), 10(C), and 10(D), and a resin flow is guided to a lower space of a component, in addition to the effect of protecting the heat dissipating material described in the first embodiment, it is possible to secure resin filling in a narrow space. A shape of the heat dissipating metal base projecting portion is not limited to the above-described shapes as long as the same effect can be obtained.

According to the present embodiment, in addition to the effect of saving and protecting the heat dissipating material, resin can be sufficiently filled even in a narrow space around a heat generating electronic component, and therefore a highly reliable resin sealing state can be realized.

Third Embodiment

Figure 11:
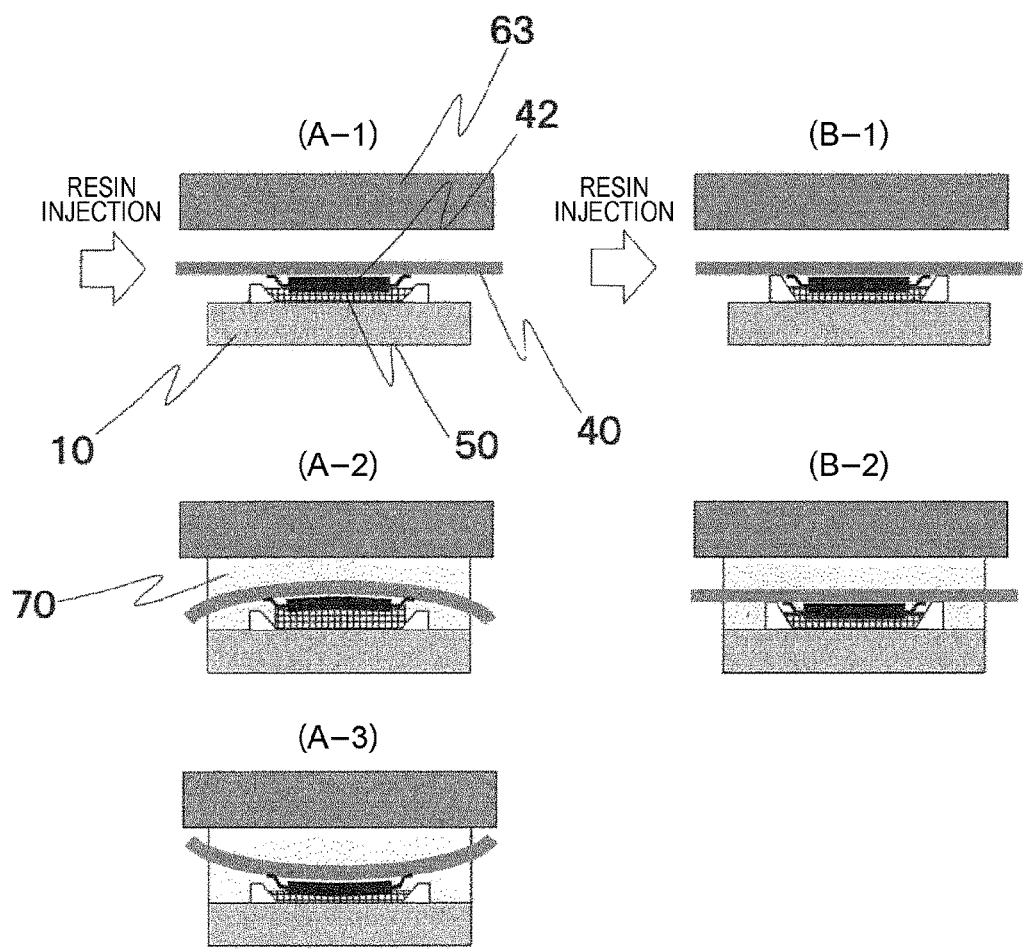
FIG. 11 is a schematic cross-sectional view indicating an effect of the heat dissipating metal base projecting portion of the onboard control device according to the present invention.

The present embodiment is a case where the heat dissipating metal base projecting portion according to the first embodiment has a shape indicated in FIG. 11(B-1). As indicated in FIG. 6, various types heights of the heat dissipating metal base projecting portion can be applied, and expected effects differ in each. In FIG. 6(A), the effect of saving and protecting the heat dissipating material described in the first embodiment is obtained. In FIG. 6(B), in addition to saving and protecting the heat dissipating material described in the second embodiment, an effect of securing resin filling in a narrow space is obtained. FIG. 6(C) indicates the case of the present embodiment.

As indicated in FIGS. 11(A-2) and (A-3), in the case where resin sealing is performed on both surfaces of a control circuit board 40, depending on molding conditions, a balance of a resin flow on the both sides of the control circuit board 40 is lost, and deformation of the control circuit substrate may occur. Depending on a molding condition, a direction of the deformation may be the case as indicated in FIGS. 11(A-2) and (A-3). In the case of the configuration indicated in FIG. 11(A-1), a resin flow injected from the left side is likely to flow over an upper portion of the control circuit board with fewer obstacles, and the flow amount can be increased. In this case, in a situation in which resin firstly concentrates in the vicinity of a resin inflow portion and then flows in a backward direction, it is predicted that the control circuit board indicated in FIG. 11(A-2) deforms in a projecting shape. On the other hand, in a situation where resin accumulates in the center portion, the deformation indicated in FIG. 11(A-3) is predicted. As the control circuit board is deformed, stress also remains on the control circuit board mounting portion (soldered portion) of a heat generating electronic component, and as a result, the reliability of the heat generating electronic component is adversely affected, and it is necessary to suppress the deformation of the control circuit board during resin sealing. In either case, the deformation is due to a force caused by a resin flow on the upper side of the control circuit board. Therefore, if the heat dissipating metal base projecting portion indicated in FIG. 11(B-1) according to the present invention hits against a lower surface of the control circuit board and supports the projecting portion, a configuration resisting the force caused by resin with a short span is realized, and the deformation of the control circuit board around the heat generating electronic component 42 is suppressed. When the heat dissipating metal base projecting portion according to the present invention is formed in the shape of FIG. 11(B-1), and the projecting portion is supported by hitting against the control circuit board, in addition to the effect of protecting the heat dissipating material, described in the first embodiment and the effect of securing resin filling in a narrow gap, described in the second embodiment, the deformation of the control circuit board during resin sealing can be suppressed.

Figure 12:
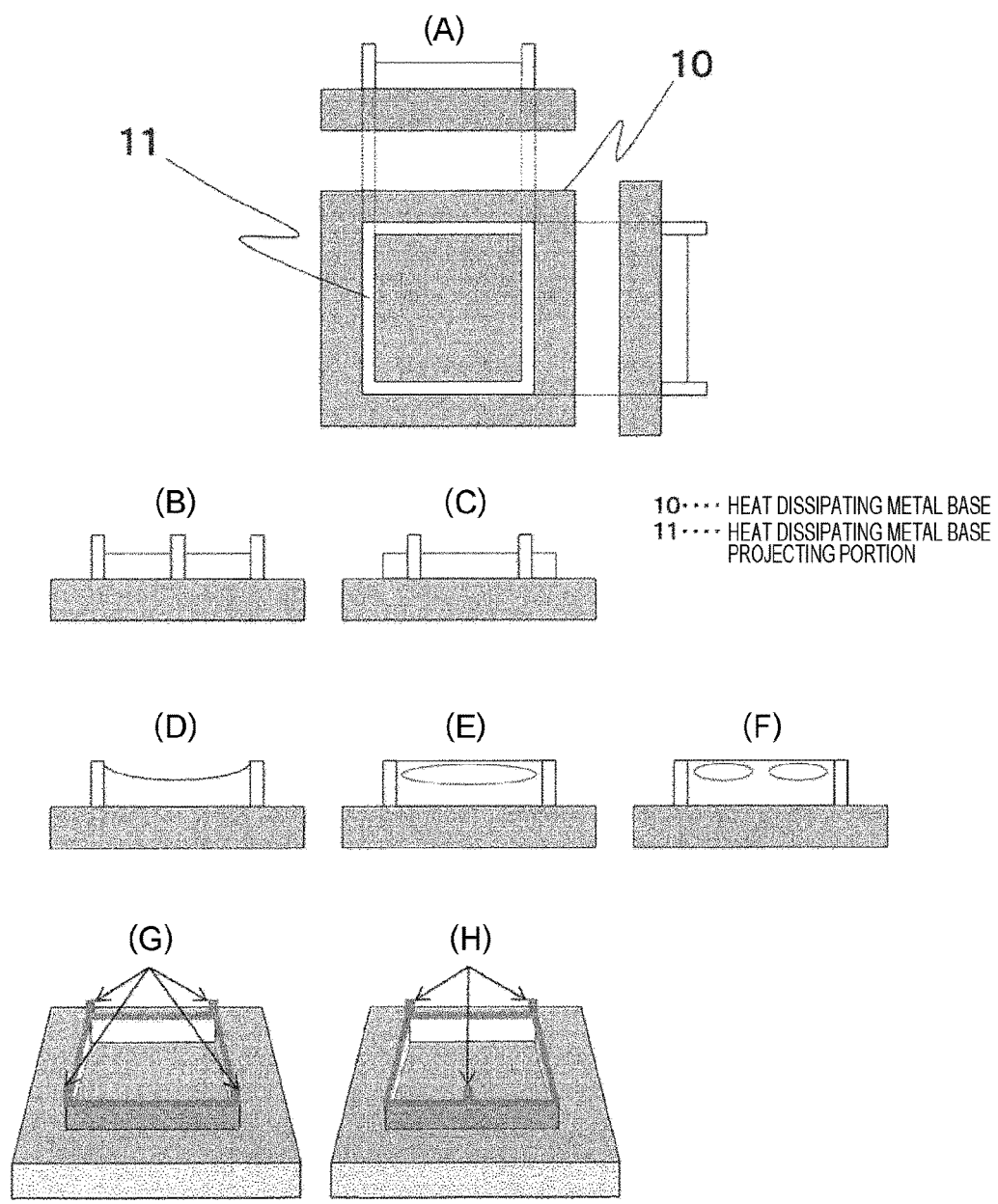
FIG. 12 is a schematic cross-sectional view and a perspective view indicating a configuration of the heat dissipating metal base projecting portion of the onboard control device according to the present invention.

Although as a shape of the heat dissipating metal base projecting portion, various shapes can be applied, FIG. 12 indicates an example. At least three projecting portions as indicated in FIG. 12(H) are required for supporting the control circuit board by hitting the projecting portion against the board. However, it is not limited as long as the projecting portion has a shape securing a resin flow path. In the various shapes indicated in FIGS. 12(A) to 12(H), the highest portion of the protruding portion is a portion hitting against the control circuit board, and a lower region functions as a resin flow passage.

According to the present embodiment, it is possible to suppress the deformation of the control circuit board during resin sealing in addition to the effect of saving and protecting the heat dissipating material and securing resin filling in a narrow gap, and also a highly reliable resin sealing state can be realized.

Fourth Embodiment

In the present embodiment, a projecting portion of a heat dissipating metal base is formed as a separate member from a heat dissipating base. It can be applied to the first to third embodiments. A material of the projecting portion can be selected from, for example, a material same as the heat dissipating metal base, another metal material, a resin material, an inorganic material such as glass or ceramics. A projection structure is formed of the above-described material in advance and fixed to a corresponding position of the heat dissipating metal base. As a fixing means, appropriate methods such as adhesion, welding, and friction joining are selected. Alternatively, a paste-like material may be cured or solidified after forming a projection shape at a predetermined position on the heat dissipating metal base by such as a dispensing technique.

According to the present embodiment, it is possible to respond flexibly even if a mounting position of the heat generating electronic component is changed due to design change.

REFERENCE SIGNS LIST 10 heat dissipating metal base
11 projecting portion
20 sealing cover
30 connector
31 metal terminal
40 control circuit board
41 electronic component
42 heat generating electronic component
50 heat dissipating material
60 lower mold
61 upper mold
62 movable mold member
63 mold member
70 sealing resin
80 waterproof filter
90 adhesive

The invention claimed is:

1. An onboard control device, comprising:
a circuit board;
a member provided to face the circuit board;
a heat generating electronic component mounted on a side of the member;
a heat dissipating material provided between the heat generating electronic component and the member;
a sealing resin configured that when filled the sealing resin is between the circuit board and the member in a direction orthogonal to a major surface of the circuit board, and substantially seals the circuit board and the heat generating electronic component,
wherein a space between the member and the circuit board is at least a part of a range where the heat dissipating material is not provided, and narrower than a range where the heat dissipating material is provided; and
the member comprises a projecting portion projecting toward the circuit board in at least a part of the range where the heat dissipating material is not provided, wherein
the projection portion functions as a breakwater for the heat dissipating material.

2. The onboard control device according to claim 1, wherein
due to the projecting portion, the space between the member and the circuit board is the at least the part of the range where the heat dissipating material is not provided, and narrower than the range where the heat dissipating material is provided.

3. The onboard control device according to claim 2, wherein the projecting portion has a shape surrounding the heat generating component without discontinuity.

4. The onboard control device according to claim 2, wherein the projecting portion is longer than a space between the member and the heat generating electronic component and projects toward the circuit board.

5. The onboard control device according to claim 2, wherein the projecting portion is in contact with the circuit board at least at three points.

6. The onboard control device according to claim 2, wherein the projecting portion includes a member different from the member.

7. The onboard control device according to claim 1, wherein the heat dissipating material is a material selected from any one of a thermally conductive resin, a thermally conductive adhesive, a thermally conductive grease, and a thermally conductive gel.

* * * * *